United States Patent
Lee et al.

(10) Patent No.: US 8,766,450 B2
(45) Date of Patent: Jul. 1, 2014

(54) LEAD PIN FOR PACKAGE SUBSTRATE

(75) Inventors: Ki Taek Lee, Seoul (KR); Hueng Jae Oh, Gyunggi-do (KR); Sung Won Jeong, Gyunggi-do (KR); Gi Sub Lee, Busan (KR); Jin Won Choi, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 496 days.

(21) Appl. No.: 12/805,559

(22) Filed: Aug. 5, 2010

(65) Prior Publication Data

US 2011/0068473 A1    Mar. 24, 2011

(30) Foreign Application Priority Data

Sep. 22, 2009 (KR) .......... 10-2009-0089707
Dec. 11, 2009 (KR) .......... 10-2009-0123275
Dec. 15, 2009 (KR) .......... 10-2009-0125087

(51) Int. Cl.
*H01L 23/28*  (2006.01)

(52) U.S. Cl.
USPC ............ 257/773; 257/E23.068; 174/126.1

(58) Field of Classification Search
USPC ............ 257/773, E23.068; 174/126.1
See application file for complete search history.

(56) References Cited

U.S. PATENT DOCUMENTS

| | | | |
|---|---|---|---|
| 6,300,678 B1 | 10/2001 | Suehiro et al. | |
| 6,359,332 B2 | 3/2002 | Shiraishi | |
| 6,583,366 B2 | 6/2003 | Saiki | |
| 7,068,520 B2 | 6/2006 | Miyamoto et al. | |
| 2001/0046796 A1 * | 11/2001 | Saiki | 439/83 |
| 2008/0055874 A1 | 3/2008 | Kawade et al. | |

FOREIGN PATENT DOCUMENTS

| | | |
|---|---|---|
| JP | 9-55244 | 2/1997 |
| JP | 2001-217341 | 8/2001 |
| JP | 2003-208938 | 7/2003 |
| KR | 10-2009-0122310 | 11/2009 |

OTHER PUBLICATIONS

Korean Office Action issued Apr. 14, 2011 in corresponding Korean Patent Application 10-2009-0125087.
Korean Office Action issued Feb. 9, 2011 in corresponding Korean Patent Application 10-2009-0089707.

* cited by examiner

*Primary Examiner* — Elias M Ullah

(57) ABSTRACT

There is provided a lead pin for a package substrate including: a connection pin being inserted into a hole formed in an external substrate; a head part formed on one end of the connection pin; and a barrier part formed on one surface of the head part in order to block the path of a solder paste so that the solder paste is prevented from flowing so as to cover the upper portion of the head part when the head part is mounted on the package substrate.

13 Claims, 10 Drawing Sheets

(a)

(b)

LEAD PIN FOR PACKAGE SUBSTRATE

CROSS-REFERENCE TO RELATED APPLICATIONS

This application claims the priority of Korean Patent Application Nos. 10-2009-0089707 filed on Sep. 22, 2009, 10-2009-0123275 filed on Dec. 11, 2009, and 10-2009-0125087 filed on Dec. 15, 2009, in the Korean Intellectual Property Office, the disclosures of which are incorporated herein by reference.

BACKGROUND OF THE INVENTION

1. Field of the Invention

The present invention relates to a lead pin for a package substrate, and more particularly, to a lead pin for a package substrate that connects a package substrate on which an integrated circuit is mounted to a main board.

2. Description of the Related Art

With the development of electronics industry, semiconductor packages in various types have been manufactured. Recently, as the wiring density of a semiconductor package has been increased, a semiconductor package substrate of a Pin Grid Array (PGA) type in which a plurality of T-type lead pins are mounted has been widely used as a substrate that connects a package substrate on which an integrated circuit (IC) is mounted to a main board.

In a general package substrate, a pin insert type in which a pin is inserted through a hole and a T-type lead pin that is attached to a package substrate by a soldering have been mainly used. The T-type lead pin has gradually become widespread due to a limitation of the available area for the circuit configuration of the package substrate as compared to the pin insert type.

As the use of lead has been recently limited in consideration of environmental effects due to soldering, a solder (Sn—Ag—Cu, and Sn—Sb) not using lead has been used, such that the melting temperature of the solder is increased.

At this time, as the melting temperature of the soldering is high, solder for connecting lead pins that support lead pins is melted by reflow heat during a reflow process for mounting an IC chip on a package substrate, thereby causing an inclination of the lead pins.

In addition, defects frequently occur, such as in the case that solder paste overflows toward the upper portions of the lead pins during the reflow process so as to be spread to connection pins and the like. Therefore, there is a demand for techniques capable of solving these problems.

SUMMARY OF THE INVENTION

An aspect of the present invention provides a lead pin for a package substrate that prevents the pollution of a connection pin due to a solder paste and increases bonding efficiency by increasing a contact area between a head part and the solder paste.

According to an aspect of the present invention, there is provided a lead pin for a package substrate including: a connection pin being inserted into a hole formed in an external substrate; a head part formed on one end of the connection pin; and a barrier part formed on one surface of the head part in order to block the path of a solder paste so that the solder paste is prevented from flowing so as to cover the upper portion of the head part when the head part is mounted on the package substrate.

The barrier part may be formed on the bottom surface of a flange part so as to be positioned on the outer side of a round part.

The barrier part may be formed on a side surface of the head part.

The barrier part may be projected, in a tapered shape, to the outer side of the round part.

The barrier part may be inclined at an angle of approximately 45° or less.

A curvature of the head part in the portion corresponding to the diameter of the connection pin may be equivalent to or larger than a curvature of the head part in the portion connecting the ends of the head part.

The head part may include a disc-type flange part formed on one end of the connection pin and a semispherical round part formed on the bottom surface of the flange part and having a smaller area than the flange part.

The head part may include a disc-type flange part formed on one end of the connection pin and a semispherical round part projected from one surface of the flange part, the round part having a larger center height than a height of the flange part.

According to another aspect of the present invention, there is provided a lead pin for a semiconductor package including: a connection pin being inserted into a hole formed in an external substrate; a head part including a flange part formed on one end of the connection pin and a plane part formed on the upper portion of the flange part and having a flat shaped end; and a barrier part formed on one surface of the head part in order to block the path of a solder paste so that the solder paste is prevented from flowing so as to cover the upper portion of the head part when the head part is mounted on the package substrate.

The plane part and the barrier part may have ends contacting each other.

The plane part and the barrier part may have contact portions formed in a curved surface.

The plane part and the barrier part may have ends spaced apart from each other.

The barrier part may be formed on a bottom surface edge side of the head part.

The barrier part may be projected, in a tapered shape, to the outer edge of the head part.

Meanwhile, according to another aspect of the present invention, there is provided a semiconductor package including: a substrate part having one surface on which a pad part is formed; and a lead pin including: a connection pin being inserted into a hole formed in an external substrate; a head part including a flange part formed on one end of the connection pin and a plane part formed on the upper portion of the flange part and having a flat shaped end; and a barrier part formed on one surface of the head part in order to block the path of a solder paste so that the solder paste is prevented from flowing so as to cover the upper portion of the head part when the head part is mounted on the package substrate, the lead pin being electrically connected to the pad part.

The plane part and the barrier part may have ends contacting each other.

The plane part and the barrier part may have contact portions formed in a curved surface.

The plane part and the barrier part may have ends spaced apart from each other.

According to another aspect of the present invention, there is provided a lead pin for a semiconductor package including: a connection pin being inserted into a hole formed in an external substrate; a head part including a flange part formed on one end of the connection pin and a projection part formed on the upper portion of the flange part and having a multi-layer shape; and a barrier part formed on one surface of the head part in order to block the path of a solder paste so that the solder paste is prevented from flowing so as to cover the upper portion of the head part when the head part is mounted on the package substrate.

The projection part may include a first plane part formed on the flange part and having a flat shape and a second plane part formed on the first plane part and having a flat shape.

The projection part may include a plane part formed on the flange part and having a flat shape and a round part formed on the plane part.

The plane part and the barrier part may have ends contacting each other.

The plane part and the barrier part may have contact portions formed in a curved surface.

According to another aspect of the present invention, there is provided a semiconductor package including: a substrate part having one surface on which a pad part is formed; and a lead pin including: a connection pin being inserted into a hole formed in an external substrate; a head part including a flange part formed on one end of the connection pin and a projection part formed on the upper portion of the flange part and having a multi-layer shape; and a barrier part formed on one surface of the head part in order to block the path of a solder paste so that the solder paste is prevented from flowing so as to cover the upper portion of the head part when the head part is mounted on the, package substrate, the lead pin being electrically connected to the pad part.

The projection part may include a first plane part formed on the flange part and having a flat shape and a second plane part formed on the first plane part and having a flat shape.

The projection part may include a plane part formed on the flange part and having a flat shape and a round part formed on the plane part.

The plane part and the barrier part may have ends spaced apart from each other.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
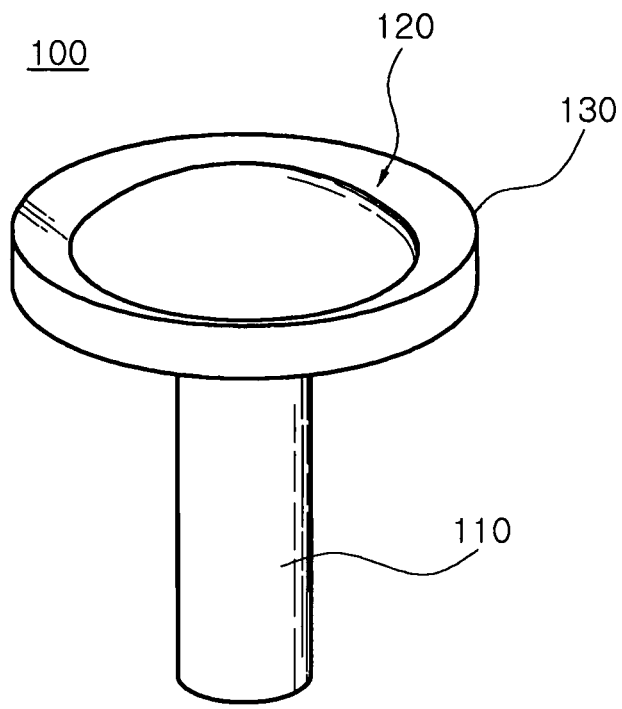
FIG. 1 is a perspective view explaining a lead pin for a package substrate according to an exemplary embodiment of the present invention.

A lead pin for a package substrate and a semiconductor package according to the present invention will now be described in more detail with reference to FIGS. 1 through 16. Exemplary embodiments of the present invention will now be described in detail with reference to the accompanying drawings.

However, it should be noted that the spirit of the present invention is not limited to the embodiments set forth herein and those skilled in the art and understanding the present invention can easily accomplish retrogressive inventions or other embodiments included in the spirit of the present invention by the addition, modification, and removal of components within the same spirit, but those are construed as being included in the spirit of the present invention.

Further, throughout the drawings, the same or similar reference numerals will be used to designate the same components or like components having the same functions in the scope of the similar idea.

Figure 2:
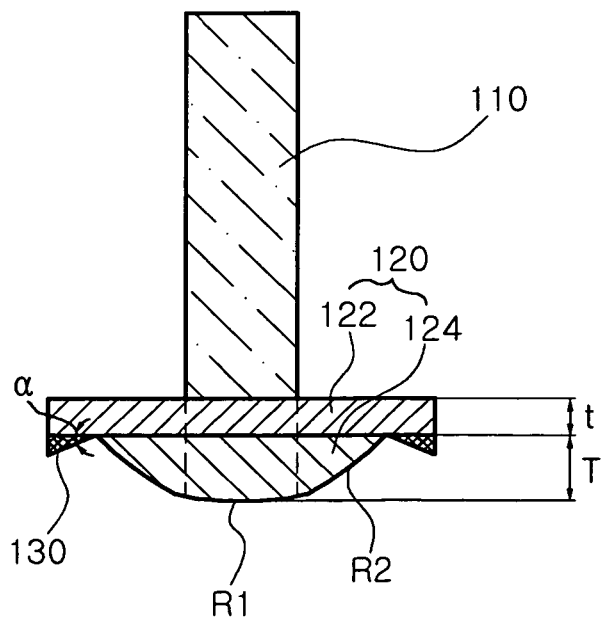
FIG. 2 is a side cross-sectional view of the lead pin for the package substrate of FIG. 1.
Figure 3:
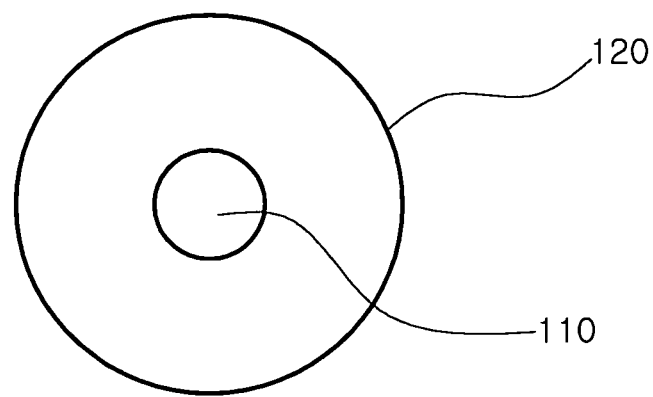
FIGS. 3 and 4 are a plan view and a bottom view of the lead pin for the package substrate of FIG. 1.
Figure 4:
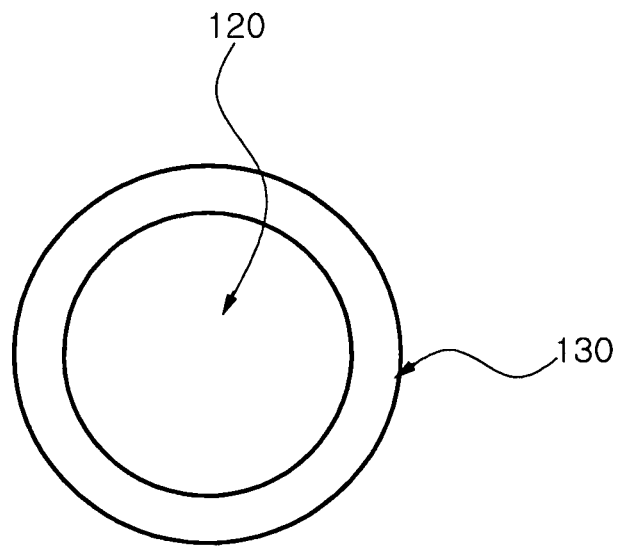

FIG. 1 is a perspective view explaining a lead pin for a package substrate according to an exemplary embodiment of the present invention, FIG. 2 is a side cross-sectional view of the lead pin for the package substrate of FIG. 1, and FIGS. 3 and 4 are a plan view and a bottom view of the lead pin for the package substrate of FIG. 1.

Referring to FIGS. 1 through 4, the lead pin for the package substrate 100 may include a connection pin 110, a head part 120, and a barrier part 130.

The connection pin 110 is a portion that is inserted into a socket or the like when the lead pin 100 is mounted on a package substrate. The connection pin 110, which may be constituted in a cylindrical form having a predetermined length according to the type of the package substrate, is projectedly coupled to the upper portion of the package substrate when the lead pin 100 is mounted.

Also, the connection pin 110 is connected to the end of the head part 120, wherein it is preferable that the center of the head part 120 matches the center of the connection pin 110.

At this time, the connection pin 110 and the head part 120 may be integrally formed and be manufactured using the same material, a conductive metal. However, the material of the connection pin 110 and the head part 120 is not limited thereto.

The head part 120 is formed integrally with the connection pin 110 as described above and is electrically connected in a portion in which a pad part 20 of the package substrate is exposed by a solder paste 10.

The head part 120 has a disc-type flange part 122 and a semispherical round part 124 that are continuously formed in one end of the connection pin 110, wherein the semispherical round part 124 is mounted so as to be contacted on the pad part 20 of the package substrate 1.

At this time, the flange part 122 may be formed so as to have a larger diameter than the round part 124 that is projected from the bottom surface thereof to form a semisphere. Therefore, when the head part 120 is bonded to the pad part 20, the solder paste 10 may be introduced into a space between the bottom surface of the flange part 122 and the outer circumferential surface of the round part 124 and be discharged to the upper surface of the flange part 122, wherein the discharge can be prevented due to the difference in diameters.

The round part 124 may have a curvature of the portion R1 corresponding to the diameter of the connection pin 110 equivalent to or larger than a curvature of the portion R2 connecting ends of the round part 124 each other.

However, the round part 124 is not limited thereto but may be formed so as to have a single curvature.

Therefore, the center of the round part 124 may be formed so as to be smoother than the peripheral parts thereof, thereby making it possible to prevent the lead pin 100 from being inclined by the round part 124. Also, the structure of the round-part 124 having the radius of curvature may induce the drawing of bubbles generated within the solder paste 10.

In addition, the flange part 122 and the round part 124 that constitute the head part 120 may have different heights t and T, wherein the center height T of the round part 124 having a predetermined curvature may be formed so as to be greater than the height t of the flange part 122.

At this time, the center height T of the round part 124 is formed so as to be greater than the height t of the flange part 122 in order to increase the area in which the solder paste 10 surrounding the head part 120 is in contact with the curved surface of the round part 124 when the head part 120 is mounted on the package substrate 1, within the design range of the head part 120.

Thereby, the connection pin 110 can be vertically installed on the package substrate 1 without being inclined and further bonding performance can be improved due to the expansion of the contact area.

Herein, the solder paste 10, made of an alloy of lead, zinc, and silver, is melted in a liquid-phase form having viscosity by applying heating and is cured in a melted-state shape by room temperature cooling, wherein the objects to be bonded are bonded each other in a cured state.

The barrier part 130 is formed on the bottom surface of the flange part 122 so as to be positioned on the outer side of the round part 124. More specifically, the barrier part 130 may be formed on the edge side of the flange part 122. At this time, the longitudinal length of the barrier part 130 may be determined depending on the difference between the diameters of the flange part 122 and the round part 124.

Also, the barrier part 130 may be projected, in a tapered shape, to the outer edge of the flange part 122. Therefore, the barrier part 130 can enlarge the height of the edge side of the flange part 122 and prevent the solder paste 10 from flowing to the upper surface of the head part 120.

At this time, the inclined angle α of the barrier part 130 may be in the range of 0 to 45°. Herein, when the angle of the barrier part 130 is 45° or more, the barrier part 130 does not effectively block the path through which the solder paste 10 flows, but is introduced into the inside of the solder paste 10 and allows the solder paste 10 to move onto the head part 120. Therefore, it is preferable that the barrier part 130 be formed in the range of 0 to 45°.

However, in the present embodiment, the barrier part 130 is not limited to the shape inclined at a predetermined angle but may also have a cross-section formed in a quadrangular form, a semicircular form, a polygonal form or the like, according to a designer's intention.

Figure 5:
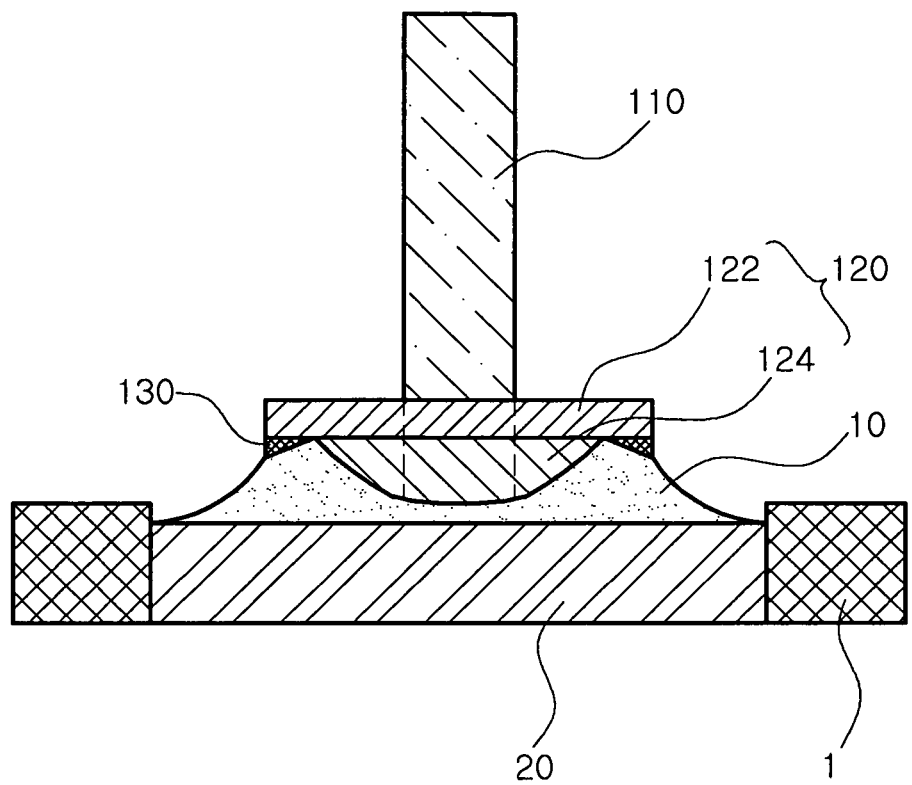
FIG. 5 is a cross-sectional view explaining a state in which a lead pin for a package substrate according to an exemplary embodiment of the present invention is mounted on a package substrate.

FIG. 5 is a cross-sectional view explaining a state in which a lead pin for a package substrate according to an exemplary embodiment of the present invention is mounted on a package substrate.

As shown in FIG. 5, a case frequently occurs in which the solder paste 10 overflows toward the upper portion of the head part 120 when the lead pin 100 is disposed on the pad part 20 of the package substrate 1 and a reflow process is subsequently performed thereupon.

In the present embodiment, the barrier part 130 is formed on the edge portion of the head part 120 to block a path through which the solder paste 10 moves, such that it can prevent the solder paste 10 from flowing to the upper portion of the head part 120, thereby making it possible to prevent the connection pin 110 from being polluted.

In addition, the lead pin for the package substrate according to the present invention has a greater contact area due to the barrier part 130 that is projected from one surface of the head part, thereby making it possible to improve bonding efficiency.

Figure 6:
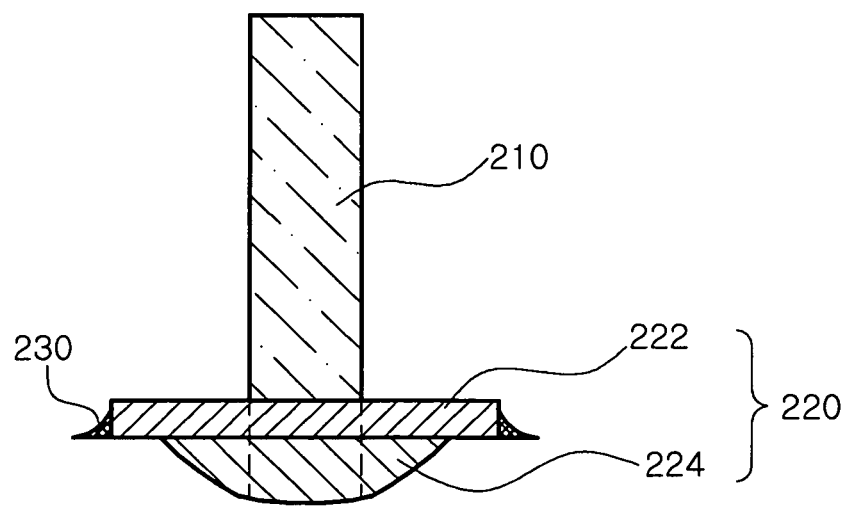
FIG. 6 is a cross-sectional view explaining a lead pin for a package according to a second embodiment of the present invention.

FIG. 6 is a cross-sectional view explaining a lead pin for a package substrate according to a second embodiment of the present invention.

Referring to FIG. 6, the lead pin for the package substrate may include a connection pin 210, a head part 220, and a barrier part 230.

At this time, the connection pin 210 and the head part 220 are substantially the same as those shown in the previous embodiment, such that the detailed description thereof may be omitted.

The barrier part 230 is formed so as to be positioned on a side surface of a flange 222, wherein it may have a shape projected from the side surface.

Also, the barrier part 230 may be projected, in a tapered shape, to the one edge of the flange part 222. Therefore, the barrier part 230 allows the length of the flange part 222 to be extended in the edge side.

Therefore, the lead pin for the package substrate according to the present embodiment includes the barrier part 230 that blocks the path of the solder paste so as to prevent the solder paste from flowing so as to cover the upper portion of the head part 220 when the head part 220 is mounted on the package substrate, such that the barrier part 230 can prevent the solder paste from flowing so as to cover the upper portion of the head part 220, thereby making it possible to prevent the connection pin from being polluted.

Figure 7:
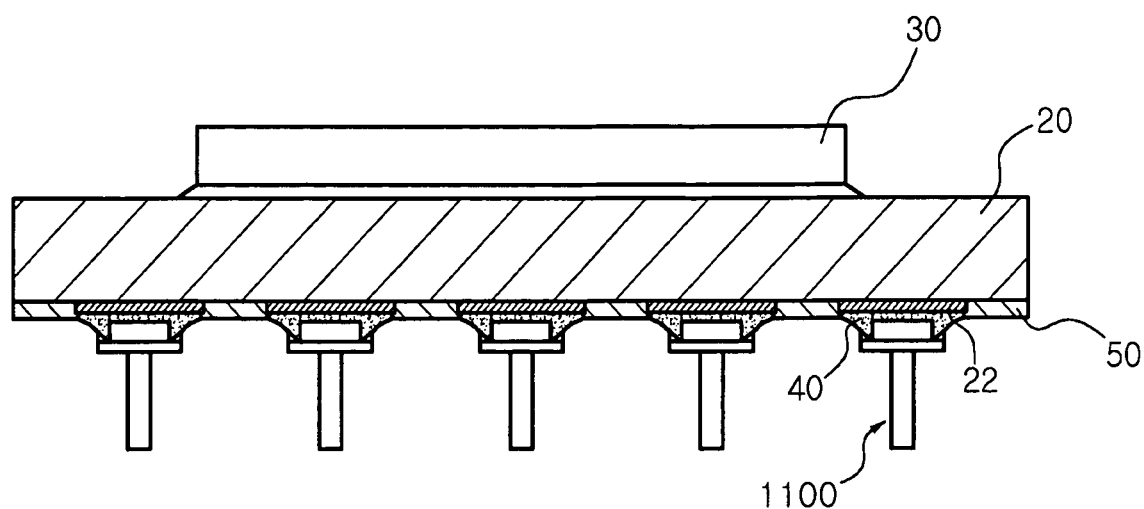
FIG. 7 is a side cross-sectional view explaining a semiconductor package according to a third embodiment of the present invention.
Figure 8:
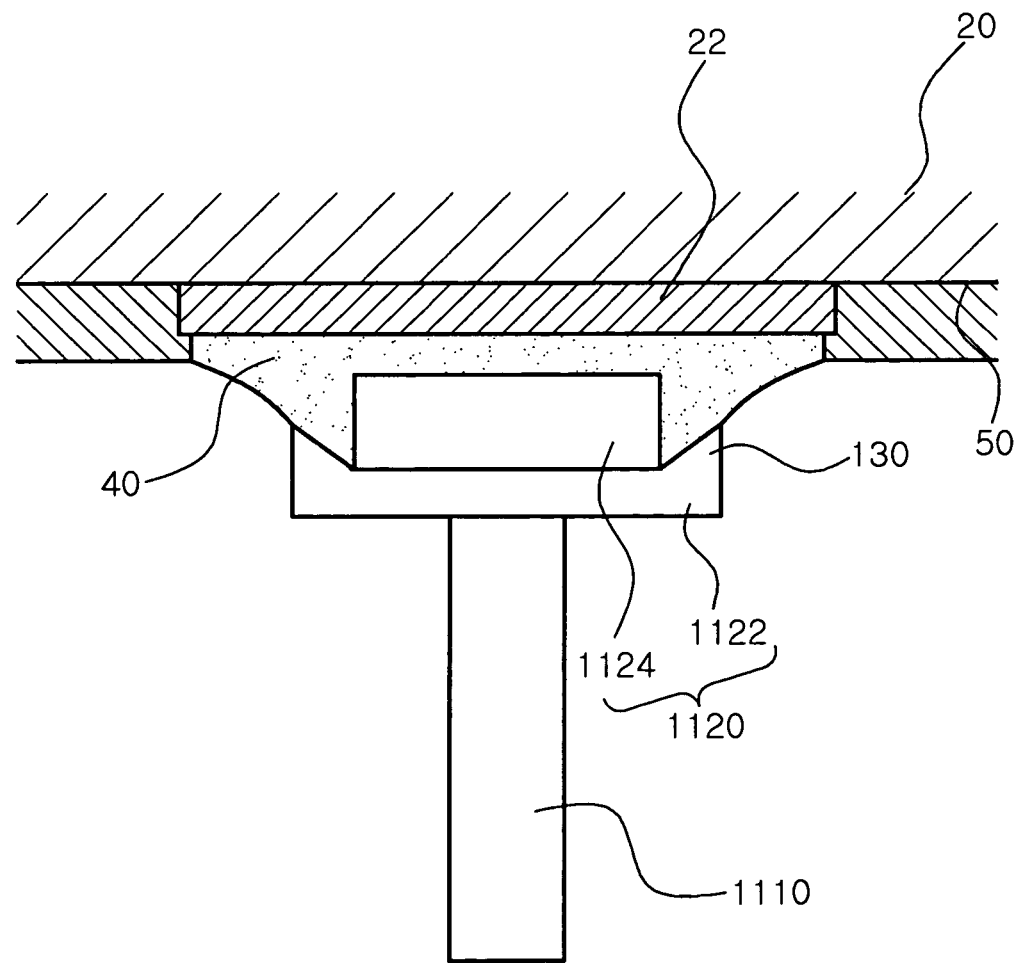
FIG. 8 is a partial cross-sectional view explaining a state in which the lead pin of FIG. 7 is mounted on a substrate.

FIG. 7 is a side cross-sectional view explaining a semiconductor package according to a third embodiment of the present invention, and FIG. 8 is a partial cross-sectional view explaining a state in which the lead pin of FIG. 7 is mounted on a substrate.

Referring to FIGS. 7 and 8, the semiconductor package 10 may include a substrate part 20 and a lead pin 1100.

A semiconductor chip 30 is electrically connected to the surface of the substrate part 20, wherein the substrate part 20 may use an organic substrate or a ceramic substrate such as a low temperature co-fired ceramic (LTCC).

In addition, a pad part 22 that is electrically connected to the lead pin 1100 may be formed on the bottom surface of the substrate part 20 and a photoresist layer 50 may be provided around the pad part 22. Also, the substrate part 20 may be manufactured in a plurality of layers, and circuit patterns that electrically connect the plurality of layers may be formed therein.

Therefore, the semiconductor chip 30 is mounted so as to be electrically connected to the substrate part 20, such that the size of the semiconductor package can become compact.

Figure 9:
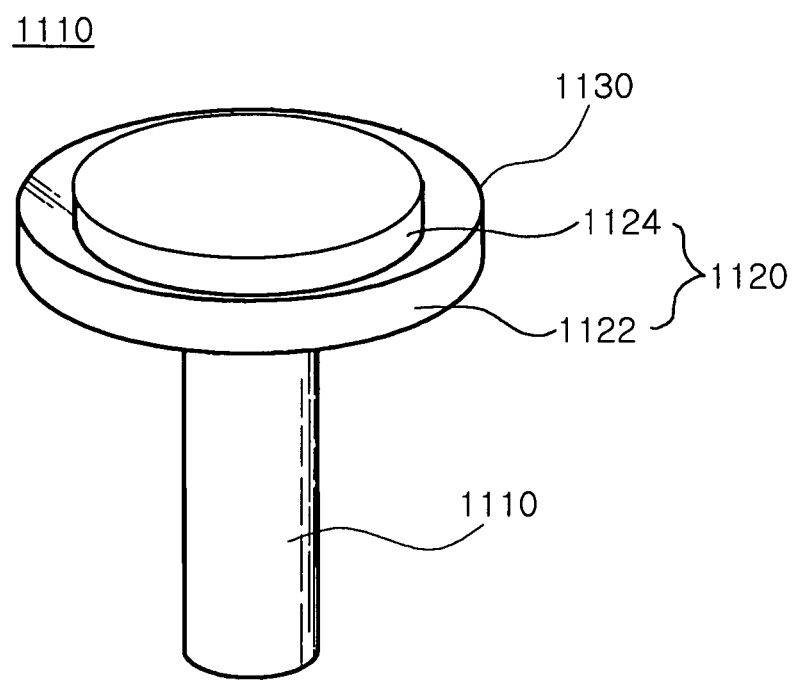
FIG. 9 is a perspective view explaining a lead pin that is mounted on a semiconductor package according to a third embodiment of the present invention.
Figure 10:
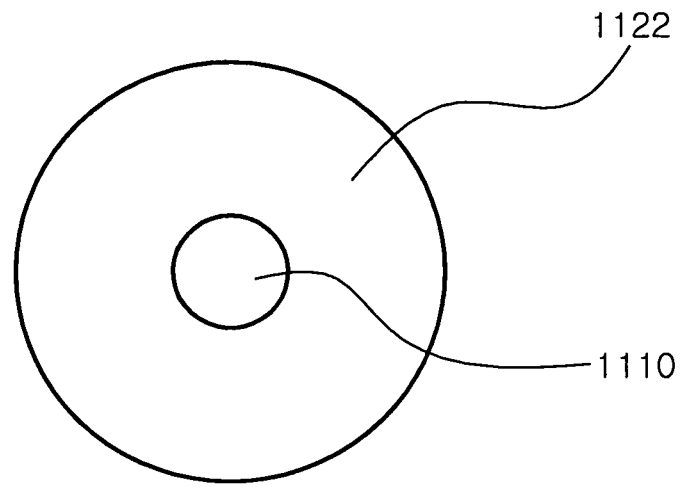
FIG. 10 is a plane view and a bottom view explaining the lead pin of FIG. 9.
Figure 10:
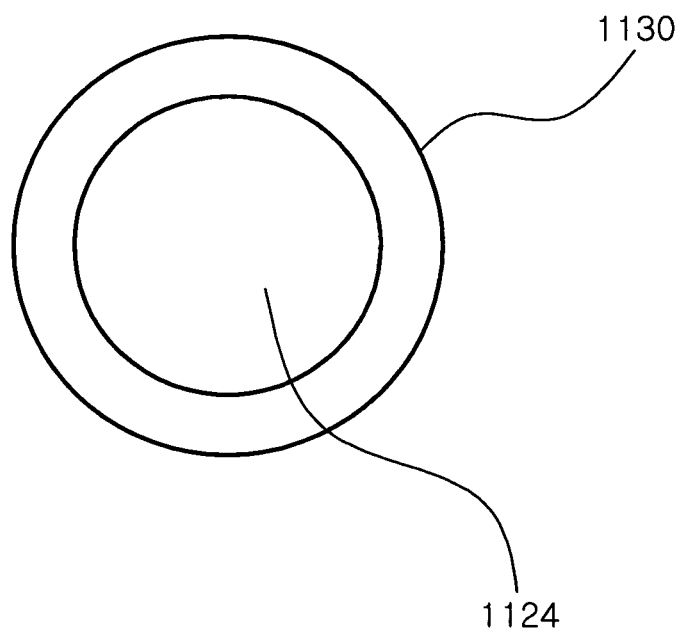

FIG. 9 is a perspective view explaining a lead pin that is mounted on a semiconductor package according to a third embodiment of the present invention, and FIG. 10 is a plane view and a bottom view explaining the lead pin of FIG. 9.

Referring to FIGS. 9 and 10, the lead pin 1100 may include a connection pin 1110, a head part 1120, and a barrier part 1130.

The connection pin 1110 is a portion that is inserted into a socket and the like when the lead pin 1100 is mounted on a package substrate. The connection pin 1110, which may be constituted in a cylindrical form having a predetermined length according to the sort of the package substrate, is projectedly coupled to the upper portion of the package substrate when the lead pin 1100 is mounted.

Also, the connection pin 1110 is connected to the end of the head part 1120, wherein it is preferable that the center of the head part 1120 matches the center of the connection pin 1110.

At this time, the connection pin 1110 and the head part 1120 may be integrally formed and be manufactured using the same material, a conductive metal. However, the material of the connection pin 1110 and the head part 1120 is not limited thereto.

The head part 1120 is formed integrally with the connection pin 1110 as described above and is electrically connected in a portion where a pad part 20 of the package substrate is exposed by a solder paste 40.

Also, the head part 1120 may include a flange part 1122 that is formed on one end of the connection pin 1110 and a plane part 1124 that is formed on the upper portion of the flange part 1122 and has a flat shaped end.

At this time, the flange part 1122 may be formed so as 1122 and has a flat shaped end.

At this time, the flange part 1122 may be formed so as to have a greater diameter than the plane part 1124 that is projected from the bottom surface thereof to form a semisphere. Therefore, when the head part 1120 is bonded to the pad part 20, the solder paste 40 may be introduced into a space between the bottom surface of the flange part 1122 and the outer circumferential surface of the plane part 1124 and be discharged to the upper surface of the flange part 1122, wherein the discharge can be prevented due to the difference in diameters.

Also, the plane part 1124 may have a flat shaped end, as shown in FIG. 9. At this time, the plane part 1124 has a smaller size than the flange part 1122 and the barrier part 1130 is provided on the flange part 1122 exposed due to such a structure.

Therefore, the plane part 1124 of the lead pin 1100 is entirely contacted to the solder paste to further increase a contact area, thereby making it possible to increase bonding strength between the head part 1120 and the solder paste 40.

In addition, the flange part 1122 and the plane part 1124 that constitute the head part 1120 may have different heights, wherein the center height of the plane part 1124 having a predetermined curvature may be formed so as to be greater than the height of the flange part 1122.

The barrier part 1130 is formed on the bottom surface of the flange part 1122 so as to be positioned on the outer side of the plane part 1124. More specifically, the barrier part 1130 may be formed on the edge side of the flange part 1122. At this time, the longitudinal length of the barrier part 1130 may be determined depending on the difference in diameters of the flange part 1122 and the plane part 1124.

However, the barrier part 1130 may be formed on the bottom surface edge side of the head part 1120 and the position of barrier part 1130 may be varied according to a designer's intention.

Also, the barrier part 1130 may be projected, in a tapered shape, to the outer edge of the flange part 1122. Therefore, the barrier part 1130 can enlarge the height of the edge side of the flange part 1122 and prevent the solder paste 40 from flowing to the upper surface of the head part 1120.

At this time, the inclined angle α of the barrier part 1130 may be in the range of 0 to 45°. Herein, when the angle of the barrier part 1130 is 45° or more, the barrier part 1130 does not block the path through which the solder paste 40 flows but is introduced into the inside of the solder paste 40 and allows the solder paste 40 to be moved onto the head part 1120. Therefore, it is preferable that the barrier part 1130 is formed the range of 0 to 45°.

However, in the present embodiment, the barrier part 1130 is not limited to the shape inclined at a predetermined angle but may also have a cross-section formed in a quadrangle form, a semicircle form, a polygon form or the like according to a designers intention.

Herein, the barrier part 1130 is manufactured by forming a groove by processing only portions adjacent to the plane part 1130, such that the outer portion thereof is projected to the outside.

In addition, the barrier part 1130 and the plane part 1124 may be provided so that their ends are connected to each other.

Therefore, in the semiconductor package and the lead pin for the semiconductor package according to the present embodiment, the barrier part 1130 can prevent the solder paste from flowing so as to cover the upper portion of the head part 1120, thereby making it possible to prevent the connection pin from being polluted.

Figure 11:
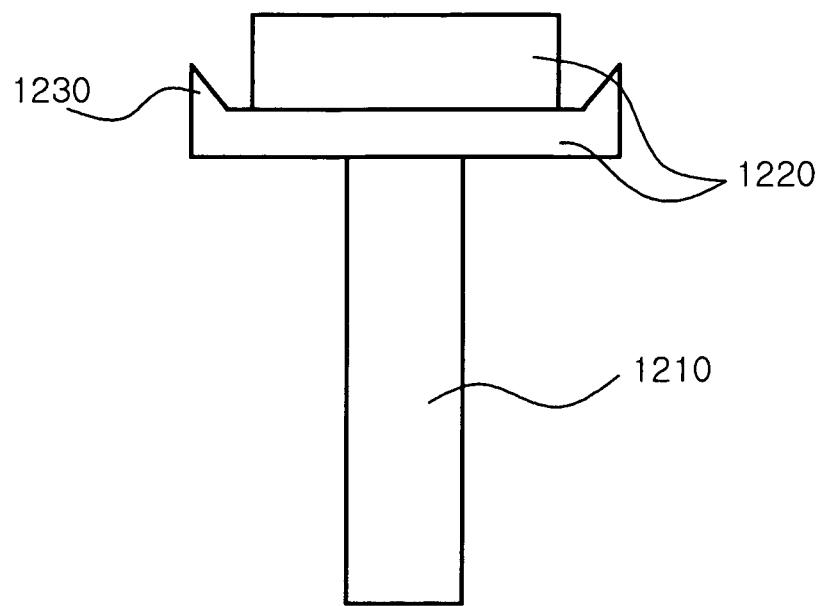
FIGS. 11 and 12 are cross-sectional views explaining a plane part and a barrier part of a lead pin according to a fourth embodiment of the present invention.
Figure 12:
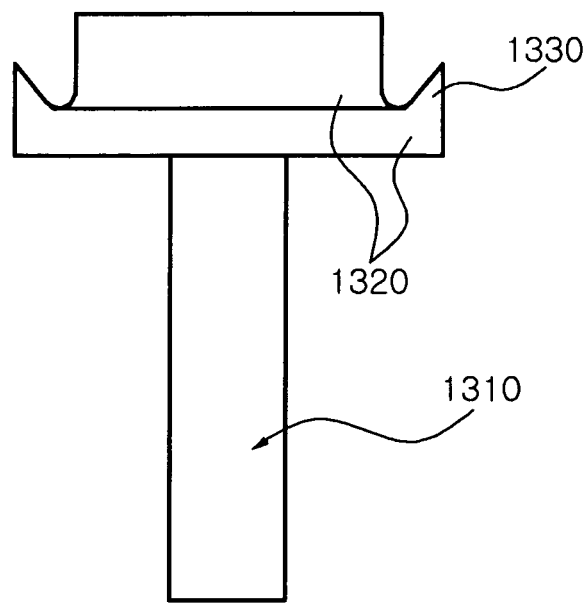

FIGS. 11 and 12 are cross-sectional views explaining a plane part and a barrier part of a lead pin according to a fourth embodiment of the present invention.

Referring to FIG. 11, the lead pin may include a connection pin 1210, a head part 1220, and a barrier part 1230.

Herein, the connection pin 1210 and the barrier part 1230 according to the present embodiment are substantially the same as those shown in the previous embodiment, such that the detailed description thereof may be omitted.

At this time, the barrier part 1230 and a plane part 1224 may be spaced apart from each other on a flange part 1222. At this time, the barrier part 1230 and the plane part 1224 may be connected to each other and the barrier part 1230 and the plane part 1224 may be spaced apart from each other by processing portions adjacent to the plane part 1224.

Referring to FIG. 12, it may be appreciated that a portion in which the plane part 1324 and the barrier part 1330 contact each other is formed so as to have a curved surface. Therefore, the position and shape of the barrier part 1330 and the plane part 1324 may be variously set.

Figure 13:
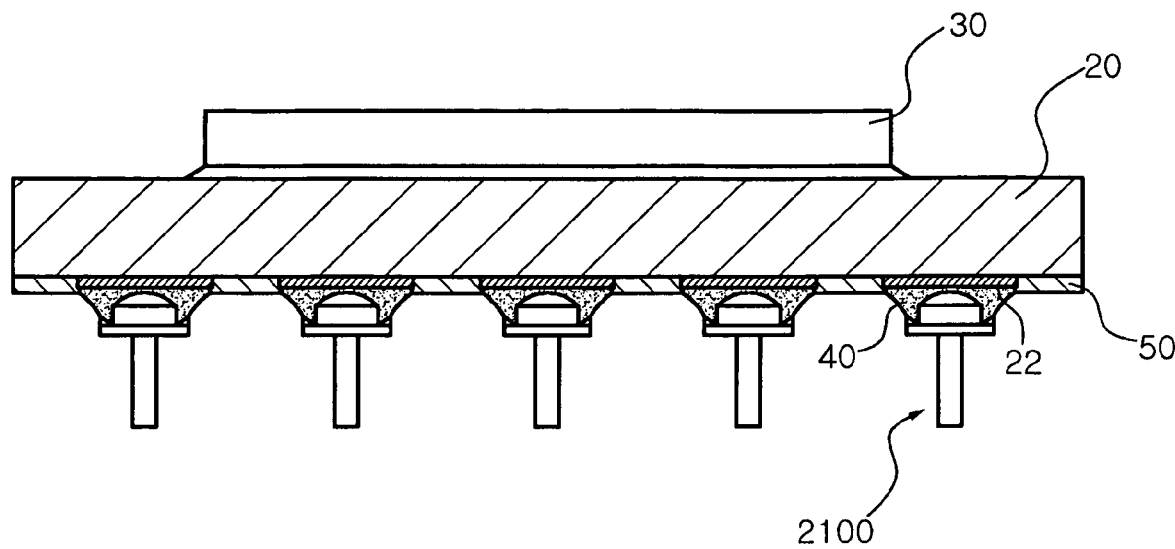
FIG. 13 is a side cross-sectional view explaining a semiconductor package according to a fifth embodiment of the present invention.
Figure 14:
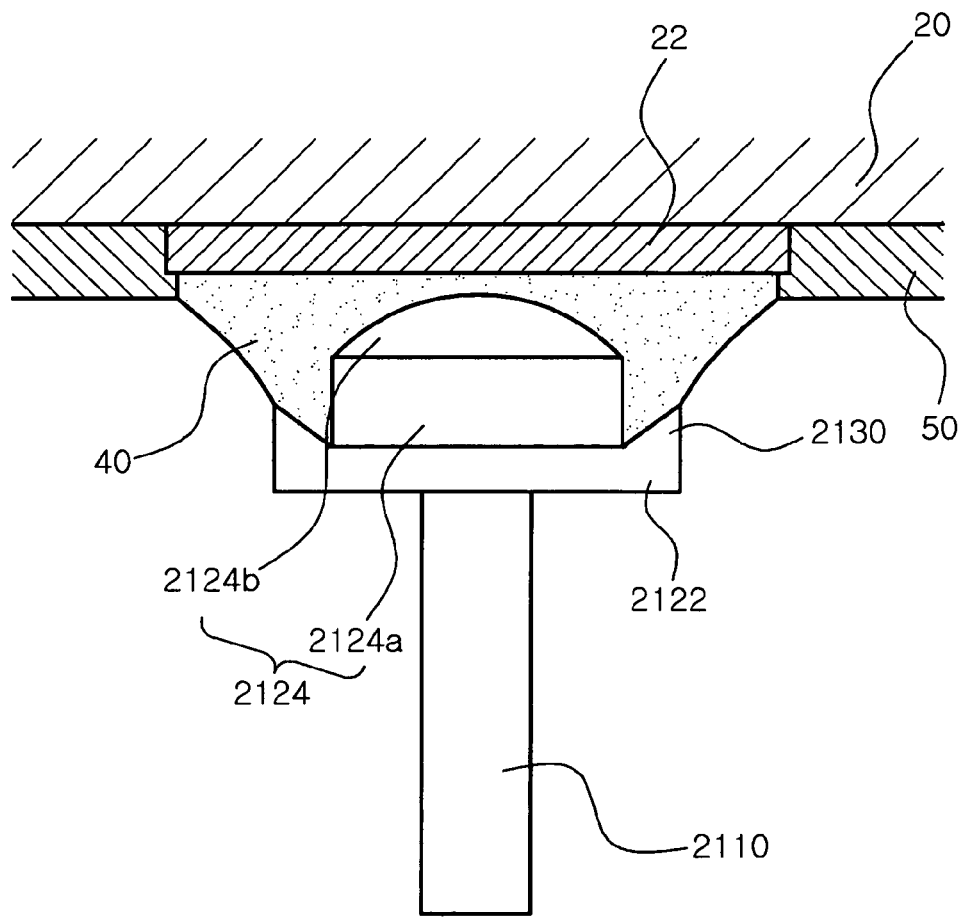
FIG. 14 is a partial cross-sectional view explaining a state in which the lead pin of FIG. 13 is mounted on a substrate.
Figure 15:
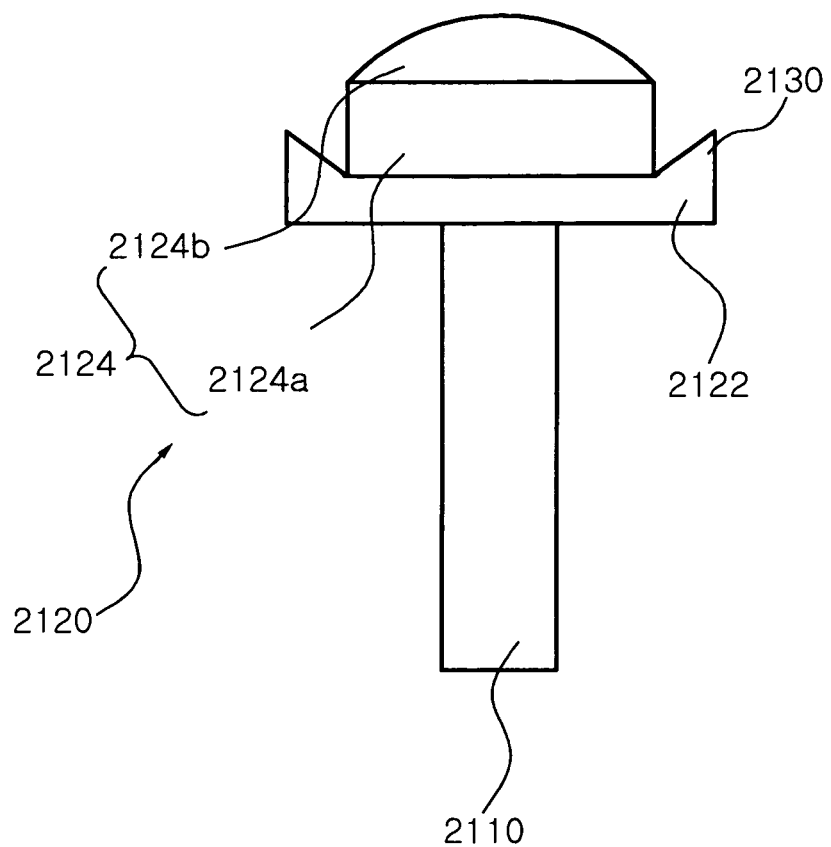
FIG. 15 is a side view explaining a lead pin that is mounted on a semiconductor package according to a fifth embodiment of the present invention.

FIG. 13 is a side cross-sectional view explaining a semiconductor package according to a fifth embodiment of the present invention, FIG. 14 is a partial cross-sectional view explaining a state in which the lead pin of FIG. 13 is mounted on a substrate, and FIG. 15 is a side view explaining a lead pin that is mounted on a semiconductor package according to a fifth embodiment of the present invention.

Referring to FIGS. 13 through 15, the semiconductor package 10 may include a substrate part 20 and a lead pin 2100.

A semiconductor chip 30 is electrically connected to the surface of the substrate part 20, wherein the substrate part 20 may use an organic substrate or a ceramic substrate such as a low temperature co-fired ceramic (LTCC).

In addition, a pad part 22 that is electrically connected to the lead pin 2100 may be formed on the bottom surface of the substrate part 20 and a photoresist layer 50 may be provided around the pad part 22. Also, the substrate part 20 may be manufactured in a plurality of layers, and circuit patterns that electrically connect the plurality of layers may be formed therein.

Therefore, the semiconductor chip 30 is mounted so as to be electrically connected to the substrate part 20, such that the size of the semiconductor package can become compact.

In the present embodiment, the lead pin 2100 may include a connection pin 2110, a head part 2120, and a barrier part 2130.

The connection pin 2110 is a portion that is inserted into a socket and the like when the lead pin 2100 is mounted on a package substrate. The connection pin 2100, which may be constituted in a cylindrical form having a predetermined length according to the type of the package substrate, is projectedly coupled to the upper portion of the package substrate when the lead pin 2100 is mounted.

Also, the connection pin 2110 is connected to the end of the head part 2120, wherein it is preferable that the center of the head part 2120 matches the center of the connection pin 2110.

At this time, the connection pin 2110 and the head part 2120 may be integrally formed and be manufactured using the same material, a conductive metal. However, the material of the connection pin 2110 and the head part 2120 is not limited thereto.

The head part 2120 is formed integrally with the connection pin 2110 as described above and is electrically connected in a portion in which a pad part 20 of the package substrate is exposed by a solder paste 40.

Also, the head part 2120 may include a flange part 2122 that is formed on one end of the connection pin 2110 and a projection part 2124 that is formed on the upper portion of the flange part 2122 and has a multi-layer shape.

Herein, the multi-layer shape may mean a structure having multi layers and, for example, a structure having a stepped shape and the like.

At this time, the flange part 2122 may be formed so as to have a greater diameter than the projection part 2124 that is projected from the bottom surface thereof to form a semisphere. Therefore, when the head part 2120 is bonded to the pad part 20, the solder paste 40 may be introduced into a space between the bottom surface of the flange part 2122 and the outer circumferential surface of the projection part 2124 and be discharged to the upper surface of the flange part 2122, wherein the discharge can be prevented due to the difference in diameters.

Also, as shown in FIG. 15, the projection part 2124 may include a plane part 2124a of which the end is a flat surface and a round part 2124b that is formed on the plane part 2124a.

At this time, the interface between the plane part 2124a and the round part 2124b may be formed so as to have the same size but it is not limited thereto.

Therefore, the projection part 2124 of the lead pin 2100 is entirely contacted to the solder paste to further increase a contact area, thereby making it possible to increase the bonding strength thereof.

In addition, the flange part 2122 and the projection part 2124 that constitute the head part 2120 may have different heights, wherein the center height of the projection part 2124 having a predetermined curvature may be formed so as to be greater than the height of the flange part 2122.

The barrier part 2130 is formed on the bottom surface of the flange part 2122 so as to be positioned on the outer side of the projection part 2124. More specifically, the barrier part 130 may be formed on the edge side of the flange part 2122. At this time, the longitudinal length of the barrier part 2130 may be determined depending on the difference in diameters of the flange part 2122 and the projection part 2124.

Also, the barrier part 2130 may be projected, in a tapered shape, to the outer edge of the flange part 2122. Therefore, the barrier part 2130 can heighten the height of the edge side of the flange part 2122 and prevent the solder paste 40 from flowing to the upper surface of the head part 2120.

At this time, the inclined angle α of the barrier part 2130 may be in the range of 0 to 45°. Herein, when the angle of the barrier part 2130 is 45° or more, the barrier part 2130 does not block the path through which the solder paste 40 flows but is introduced into the inside of the solder paste 40 rather to allow the solder paste 40 to move onto the head part 2120. Therefore, it is preferable that the barrier part 2130 is formed in the range of 0 to 45°.

However, in the present embodiment, the barrier part 2130 is not limited to the shape inclined at a predetermined angle but may also have a cross-section formed in a quadrangular form, a semicircular form, a polygonal form or the like, according to a designer's intention.

Herein, the barrier part 2130 is manufactured by forming a groove by processing only portions adjacent to the projection part 2124, such that the outer portion thereof is projected to the outside.

In addition, the barrier part 2130 and the projection part 2124 may be provided so that their ends are connected to each other. At this time, the portion where barrier part 2130 is connected to the projection part 2124 may be rounded.

Therefore, in the semiconductor package and the lead pin for the semiconductor package according to the present embodiment, the barrier part 2130 can prevent the solder paste from flowing so as to cover the upper portion of the head part 2120, thereby making it possible to prevent the connection pin from being polluted.

Figure 16:
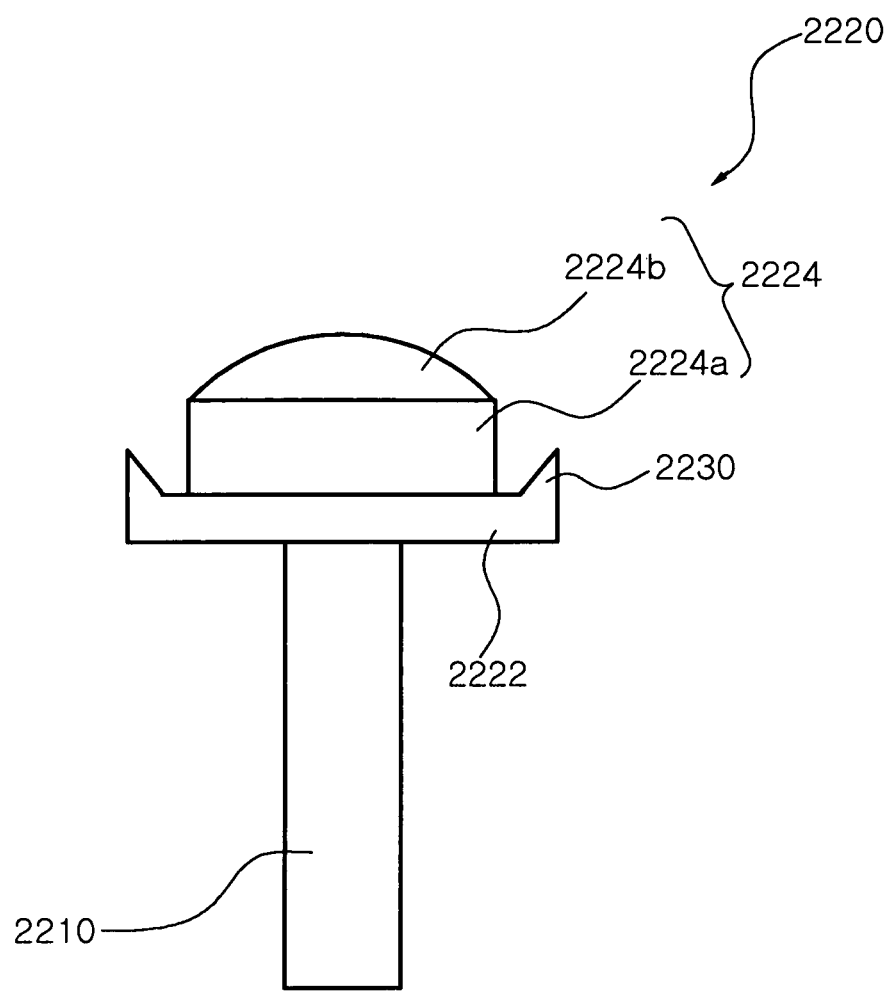
FIG. 16 is a cross-sectional view explaining a plane part and a barrier part of a lead pin according to a sixth embodiment of the present invention.

FIG. 16 is a cross-sectional view explaining a plane part and a barrier part of a lead pin according to a sixth embodiment of the present invention.

Referring to FIG. 16, the lead pin may include a connection pin 2210, a head part 2220, and a barrier part 2230.

Herein, the connection pin 2210 and the barrier part 2230 according to the present embodiment are substantially the same as those shown in the previous embodiment, such that the detailed description thereof may be omitted.

The head part 2220 includes a projection part 2224, wherein the projection part 2224 may include a first plane part 2224a of which the end is a flat surface and a second plane part 2224b that is formed on the first plane part 2224a, as shown in FIG. 16.

At this time, the barrier part 2230 and the projection part 2224 may be spaced apart from each other on a flange part 2222. Herein, the barrier part 2230 and the projection part 2224 may be connected to each other and the barrier part 2230 and the projection part 2224 may be spaced apart from each other by processing portions adjacent to the projection part 2224.

Therefore, the projection part 2224 of the lead pin is entirely contacted to the solder paste to further increase a contact area, thereby making it possible to increase the bonding strength thereof.

As set forth above, according to exemplary embodiments of the invention, the lead pin for the package substrate includes the barrier part that blocks the path of the solder paste in order to prevent the solder paste from flowing so as to cover the upper portion of the head part when the head part is mounted on the package substrate, such that the barrier part prevents the solder paste from flowing so as to cover the upper portion of the head part, thereby making it possible to prevent the connection pin from being polluted.

In addition, the lead pin for the package substrate according to the present invention has the contact area more increased by the barrier part that is projected from one surface of the head part, thereby making it possible to improve bonding efficiency.

In addition, the present invention includes the plane part formed on the upper portion of the flange part and having the flat-shaped end and the projection part formed on the upper portion of the flange part and having the multi-layer shape, such that the contact area between the head part and the solder paste is increased, thereby making it possible to improve bonding efficiency.

While the present invention has been shown and described in connection with the exemplary embodiments, it will be apparent to those skilled in the art that modifications and variations can be made without departing from the spirit and scope of the invention as defined by the appended claims.

What is claimed is:

1. A lead pin for a package substrate, comprising:
a connection pin adapted to be inserted into a hole formed in an external substrate; a head part formed on one end of the connection pin, the head part including a disc-type flange part formed on one end of the connection pin, and a semispherical round part formed on the bottom surface of the flange part and having a smaller area than the flange part; and a barrier part projecting from the flange part, and formed around a portion of the head part and on one surface of the head part in order to block the path of a solder paste so that the solder paste is prevented from flowing so as to cover the upper portion of the head part when the head part is mounted on the package substrate, the barrier part having an inner diameter equal to or larger than a diameter of the semispherical round part and being projected, in a tapered shape, from a side or bottom surface of the flange part.

2. The lead pin for the package substrate of claim 1, wherein the barrier part is formed on the bottom surface edge side of the flange part.

3. The lead pin for the package substrate of claim 1, wherein the barrier part is formed on a side surface of the head part.

4. The lead pin for the package substrate of claim 1, wherein the barrier part is inclined at an angle of approximately 45° or less.

5. The lead pin for the package substrate of claim 1, wherein a curvature of center of the round part in the portion corresponding to the diameter of the connection pin is equivalent to or larger than a curvature of the round part in the portion connecting the ends of the round part.

6. The lead pin for the package substrate of claim 1, wherein the round part has a larger center height than a height of the flange part.

7. The lead pin for the package substrate of claim 1, wherein the head part further includes a plane part between the semispherical round part and the disc-type flange part, the plane part having a substantially vertical lateral surface.

8. The lead pin for the package substrate of claim 7, wherein the plane part and the barrier part have ends contacting each other.

9. The lead pin for the package substrate of claim 7, wherein the plane part and the barrier part have contact portions formed in a curved surface.

10. The lead pin for the package substrate of claim 7, wherein the plane part and the barrier part have ends spaced apart from each other.

11. The lead pin for the package substrate of claim 7, wherein the barrier part is formed on a bottom surface edge side of the head part.

12. A semiconductor package, comprising: a substrate part having one surface on which a pad part is formed; and the lead pin for the package substrate of claim 1, the lead pin being electrically connected to the pad part.

13. The semiconductor package of claim 12, wherein the head part further includes a plane part between the semispherical round part and the disc-type flange part, the plane part having a substantially vertical lateral surface.

* * * * *